United States Patent
Kim et al.

(10) Patent No.: US 8,822,279 B2
(45) Date of Patent: Sep. 2, 2014

(54) THIN FILM TRANSISTOR DISPLAY PANEL AND MANUFACTURING METHOD THEREOF

(71) Applicant: Samsung Display Co., Ltd., Yongin (KR)

(72) Inventors: Hyung-Jun Kim, Yongin-si (KR); Chang-Oh Jeong, Suwon-si (KR); Jae-Hong Kim, Seoul (KR)

(73) Assignee: Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/036,668

(22) Filed: Sep. 25, 2013

(65) Prior Publication Data

US 2014/0024157 A1     Jan. 23, 2014

Related U.S. Application Data

(62) Division of application No. 13/010,656, filed on Jan. 20, 2011, now Pat. No. 8,558,240.

(30) Foreign Application Priority Data

Aug. 18, 2010  (KR) ........................ 10-2010-0079991

(51) Int. Cl.
*H01L 21/84* (2006.01)
(52) U.S. Cl.
USPC ......... 438/151; 257/59; 257/72; 257/E21.414
(58) Field of Classification Search
CPC .............. H01L 29/4908; H01L 27/124; G02F 1/136286; G02F 2001/13629
USPC ...................... 257/59, 72, E29.117, E29.273, 257/E21.414; 438/151; 349/46
See application file for complete search history.

(56) References Cited

U.S. PATENT DOCUMENTS

| | | | |
|---|---|---|---|
| 6,451,685 B1 | 9/2002 | Ahn et al. | |
| 7,492,420 B2 * | 2/2009 | Cho et al. ........................ | 349/43 |

(Continued)

FOREIGN PATENT DOCUMENTS

| | | |
|---|---|---|
| JP | 4362275 | 8/2009 |
| KR | 10-0766704 | 10/2007 |
| KR | 10-0792408 | 1/2008 |
| KR | 10-0862149 | 9/2008 |

(Continued)

OTHER PUBLICATIONS

Non-Final Office Action issued on Mar. 6, 2013 in U.S. Appl. No. 13/010,656.

(Continued)

*Primary Examiner* — Minh-Loan T Tran
(74) *Attorney, Agent, or Firm* — H.C. Park & Associates, PLC

(57) ABSTRACT

A thin film transistor display panel includes a substrate, a gate wire on the substrate and including a gate line and a gate electrode; a gate insulating layer on the gate wire; a semiconductor layer on the gate insulating layer; a data wire including a source electrode on the semiconductor layer, a drain electrode opposing the source electrode with respect to the gate electrode, and a data line; a passivation layer on the data wire having a contact hole exposing the drain electrode; and a pixel electrode on the passivation layer and connected to the drain electrode through the contact hole. The gate wire has a first region and second region where the gate line and the gate electrode are positioned, respectively. The thickness of the gate wire in the first region is greater than the thickness of the gate wire in the second region.

10 Claims, 12 Drawing Sheets

(56) References Cited

U.S. PATENT DOCUMENTS

| | | |
|---|---|---|
| 7,511,300 B2 | 3/2009 | Lee et al. |
| 7,919,795 B2 | 4/2011 | Lee et al. |
| 7,977,128 B2 * | 7/2011 | Cho et al. ............ 438/30 |
| 8,199,297 B2 | 6/2012 | Youn et al. |
| 2007/0148336 A1 | 6/2007 | Bachrach et al. |
| 2008/0268280 A1 | 10/2008 | Cho et al. |
| 2008/0314628 A1 | 12/2008 | Song et al. |
| 2009/0180044 A1 | 7/2009 | Kim et al. |
| 2009/0284677 A1 * | 11/2009 | Shin et al. ............ 349/46 |

FOREIGN PATENT DOCUMENTS

| | | |
|---|---|---|
| KR | 4362275 | 8/2009 |
| KR | 10-2009-0111529 | 10/2009 |
| KR | 10-2009-0121680 | 11/2009 |

OTHER PUBLICATIONS

Notice of Allowance issued on Jun. 20, 2013 in U.S. Appl. No. 13/010,656.

* cited by examiner

THIN FILM TRANSISTOR DISPLAY PANEL AND MANUFACTURING METHOD THEREOF

CROSS REFERENCE TO RELATED APPLICATIONS

This application is a divisional of U.S. patent application Ser. No. 13/010,656, filed on Jan. 20, 2011 and claims priority to and the benefit of Korean Patent Application No. 10-2010-0079991, filed on Aug. 18, 2010, all of which are hereby incorporated by reference for all purposes as if fully set forth herein.

BACKGROUND OF THE INVENTION

1. Field of the Invention

Exemplary embodiments of the present invention relate to a thin film transistor display panel and a manufacturing method the same.

2. Discussion of the Background

In general, flat panel displays such as a liquid crystal display (LCD) or an organic light emitting diode (OLED) display may include a plurality of electric field generating electrode pairs and an electro-optical active layer interposed between the electrode pairs.

In a case of an LCD, a liquid crystal layer is included as an electro-optical active layer, and in a case of an OLED display, an organic light emitting layer is included as an electro-optical active layer.

In a pair of electric field generating electrodes, one of the electrodes is generally connected to a switching element to receive an electrical signal, and an electro-optical active layer converts the electrical signal to an optical signal to display an image.

In flat panel displays, thin film transistors (TFT), which typically contain three-terminals, are used as switching elements. The flat panel displays include signal lines such as gate lines transmitting scanning signals to control the thin film transistor and data lines transmitting signals that can be applied to pixel electrodes.

As the surface area of a display increases, signal lines become longer, leading to increased resistance and power consumption.

When resistance increases, signal delay or voltage drop may occur. Therefore, forming signal lines with materials having low resistances may overcome this problem. For example, low-resistance copper may be used as signal line material.

Information contained in this section is only for enhancement of understanding of the background of the invention, and it may include information that does not form part of the prior art.

SUMMARY OF THE INVENTION

Exemplary embodiments of the present invention provide a thin film transistor display panel that may have reduced resistance and a manufacturing method thereof.

Exemplary embodiments of the present invention also provide a thin film transistor display panel with signal lines having large cross-sectional areas and a manufacturing method thereof.

Additional features of the invention will be set forth in the description which follows and, in part, will be apparent from the description or may be learned by practice of the invention.

An exemplary embodiment of the present invention discloses a thin film transistor display panel that comprises a substrate; a gate wire line arranged on the substrate and comprising a gate line extending in a first direction and a gate electrode protruding from the gate line; a gate insulating layer disposed on the gate wire line; a semiconductor layer arranged on the gate insulating layer; and a data wire line. The data wire line comprises a source electrode disposed on the semiconductor layer; a drain electrode disposed on the semiconductor layer and opposing the source electrode with respect to the gate electrode; and a data line extending in a second direction and intersecting the gate line. The film transistor display panel also comprises a passivation layer disposed on the data wire line and comprising a contact hole exposing the drain electrode and a pixel electrode disposed on the passivation layer and connected to the drain electrode through the contact hole. The gate wire line comprises a first region where the gate line is positioned and a second region where the gate electrode is positioned, and the thickness of the gate wire line in the first region is greater than the thickness of the gate wire line formed in the second region.

An exemplary embodiment of the present invention also discloses a manufacturing method for a thin film transistor display panel. The method comprises forming a gate wire line extending in a first direction on a substrate. The gate wire line comprises a lower gate line arranged in the first direction and a gate electrode protruding from the lower gate line. The method also comprises forming a first blocking layer on the gate electrode; forming an upper gate line on the lower gate line; forming a gate insulating layer on the upper gate line; forming a semiconductor layer on the gate insulating layer; and forming a data wire line. The date wire line comprises a source electrode disposed on the semiconductor layer; a drain electrode disposed on the semiconductor layer and opposing the source electrode with respect to the gate electrode; and a lower data line extending in a second direction and intersecting the gate line. The method additionally comprises forming a passivation layer disposed on the data wire line and comprising a contact hole exposing the drain electrode and forming a pixel electrode disposed on the passivation layer and connected to the drain electrode through the contact hole.

An exemplary embodiment of the present invention also discloses a display panel that comprises a substrate and a gate wire disposed on the substrate. The gate wire comprises a gate line and a gate electrode protruding from the gate line wherein the thickness of the gate line is greater than the thickness of the gate electrode. The display panel also comprises a date wire disposed on the substrate and comprising a data line and a date electrode protruding from the data line. The thickness of the date line is greater than the thickness of the gate line.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and, together with the description, serve to explain the principles of the invention.

DETAILED DESCRIPTION OF THE ILLUSTRATED EMBODIMENTS

Figure 1:
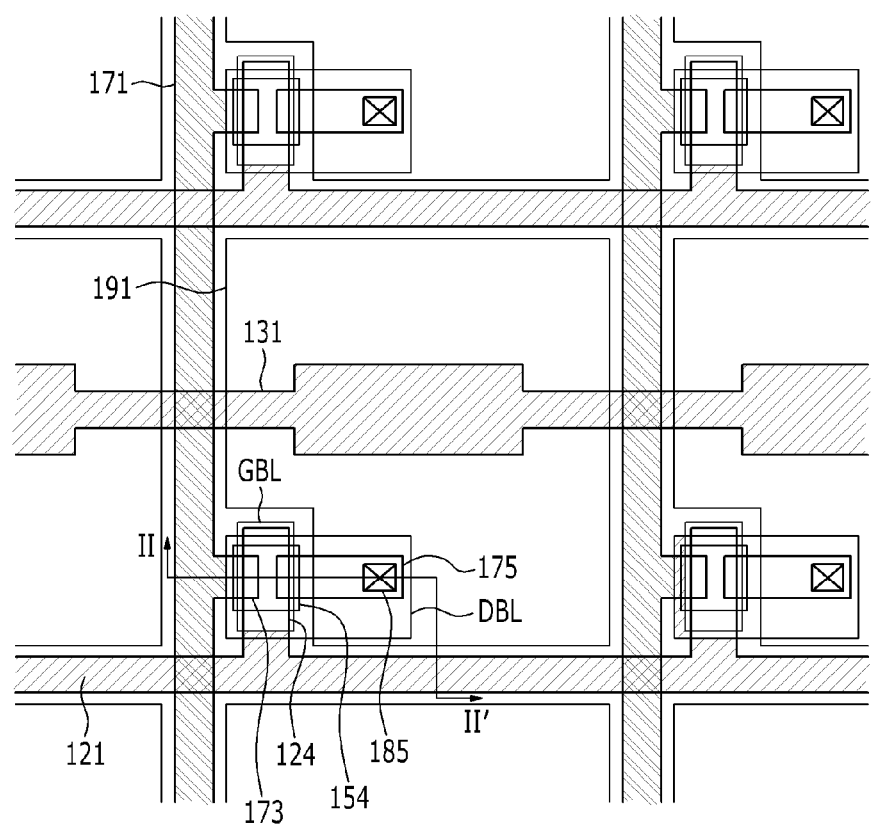
FIG. 1 is a layout view of a thin film transistor display panel according to an exemplary embodiment of the present invention.

The invention is described more fully hereinafter with reference to the accompanying drawings in which embodiments of the invention are shown. This invention may be embodied in many different forms and should not be construed as limited to the embodiments set forth herein. Rather, these embodiments are provided so that this disclosure is thorough and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on," "connected to," or "coupled to" another element or layer, it can be directly on, directly connected to, directly coupled to the other element or layer, or intervening elements or layers may be present. In contrast, when an element is referred to as being "directly on," "directly connected to," or "directly coupled to" another element or layer, there are no intervening elements or layers present.

First, a thin film transistor display panel according to an exemplary embodiment of the present invention is described with reference to FIG. 1 and FIG. 2.

FIG. 1 is a layout view of a thin film transistor display panel according to an exemplary embodiment of the present invention.

Figure 2:
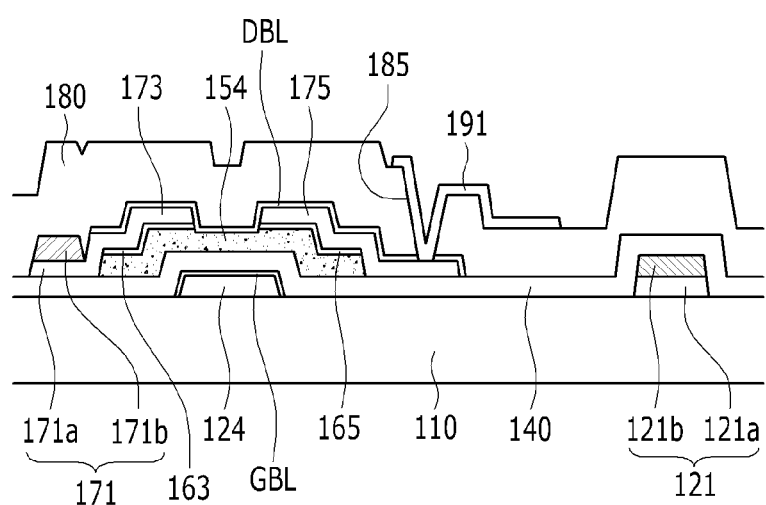
FIG. 2 shows a cross-section along line II-II' of the thin film transistor display panel shown in FIG. 1.

FIG. 2 is a cross-section along line II-II' of the thin film transistor display panel shown in FIG. 1.

Referring to FIG. 1 and FIG. 2, gate lines 121 and storage electrode lines 131 are positioned on an insulation substrate 110 that may include, for example, transparent glass or plastic. The gate lines 121 transmit gate signals and generally extend in a transverse direction.

The gate lines 121 according to this exemplary embodiment of the present invention include lower gate lines 121a extending in the transverse direction, upper gate lines 121b positioned on the lower gate lines 121a, gate electrodes 124 protruding upwardly from the lower gate lines 121a, and large-area gate pads (not shown) for connection with other layers or external drive circuits.

A first blocking layer GBL is positioned on each of the gate electrodes 124.

The upper gate lines 121b may be positioned on the entire top surfaces of the lower gate lines 121a that are not covered by the first blocking layer GBL. That is, the upper gate lines 121b are not disposed on the gate electrodes 124.

The upper gate lines 121b may be formed in the same shape as the lower gate lines 121a.

The first blocking layer GBL may be formed from an organic layer or inorganic layer such as a silicon nitride (SiNx).

The lower gate lines 121a and the gate electrodes 124 may be formed, e.g., through a deposition process that may include a sputtering method. The upper gate lines 121b may be formed by using an electroless plating method using the lower gate lines 121a as a seed layer.

The storage electrode lines 131 receive a voltage, may extend almost side by side with the gate lines 121, and may be disposed at substantially constant intervals from two neighboring gate lines 121. However, the shape and layout of the storage electrode lines 131 may be modified in various ways. For example, the storage electrode line 131 may have a uniform width or the width may vary. Also, instead of being linear, the storage electrode line 131 may have a bent shape and may not maintain the same distance from the gate line 121 along its length.

The gate lines 121 and the storage electrode lines 131 may be formed of aluminum having a low resistance or an aluminum-based metal such as an aluminum alloy.

Additionally, the gate lines 121 and the storage electrode lines 131 may be formed of a silver-based metal such as silver or a silver alloy, a copper-based metal such as copper or a copper alloy, a molybdenum-based metal such as molybdenum or a molybdenum alloy, chromium, tantalum, and titanium, and combinations of these materials. The gate lines 121 and the storage electrode lines 131 may have a multi-layer structure including two conductive layers (not shown) that may have different physical properties.

Specifically, the upper gate lines 121b and the lower gate lines 121a may be formed from the same material.

A gate insulating layer 140 that may contain a material such as a silicon nitride or a silicon oxide (SiOx) is disposed on the gate lines 121 and the first blocking layer GBL.

A semiconductor layer 154 of a material such as hydrogenated amorphous silicon or polysilicon is disposed on the gate insulating layer 140.

Ohmic contact layers 163 and 165 are disposed on the semiconductor layer 154.

The ohmic contact layers 163 and 165 may be formed of a material such as n+ hydrogenated amorphous silicon doped with an n-type impurity such as phosphorous at high concentration, or the ohmic contact layers 163 and 165 may be formed from a silicide.

Source electrodes 173 and drain electrodes 175 are opposingly arranged on the ohmic contact layers 163 and 165, respectively, and on the gate electrodes 124.

The data lines 171 longitudinally extend on the gate insulating layer 140 to intersect the gate lines 121.

The source electrodes 173 protrude from the data lines 171, which transmit data signals.

In the present exemplary embodiment, the data lines 171 include lower data lines 171a and upper data lines 171b positioned on the lower data lines 171a. The lower data lines 171a may be in the same layer as the source electrodes 173 and the drain electrodes 175.

The data lines 171 may further include data pads (not shown) having large-area end parts for connection with other layers or external drive circuits.

One gate electrode 124, one source electrode 173, and one drain electrode 175 form one thin film transistor (TFT) together with the semiconductor layer 154, and the channel of the TFT is formed in the semiconductor layer 154 between the source electrode 173 and the drain electrode 175.

A second blocking layer DBL may be formed to cover the source electrodes 173, the exposed semiconductor layer 154, and the drain electrodes 175.

In other words, the second blocking layer DBL may cover regions where thin film transistor has been formed.

The first blocking layer GBL and the second blocking layer DBL block growth of the underlying portions of the layers that they cover so that, during the electroless plating process, those layers remain the original thickness. On the other hand, layers not covered by first and second blocking layers GBL and DBL increase in thickness due to plating of materials on them.

The upper data lines 17 lb may be positioned on the entire top surfaces of the lower data lines 171a which are not covered by the second blocking layer DBL.

The upper data lines 17 lb may be formed in the same shape as the lower data lines 171a.

The second blocking layer DBL may contain an organic material or an inorganic material including silicon nitride (SiNx).

The lower data lines 171a, the source electrodes 173, and the drain electrodes 175 may be formed by using a sputtering method, and the upper data lines 171b may be formed by using an electroless plating method using the lower data lines 171a as a seed layer.

A passivation layer 180 is formed on the data lines 171 and the second blocking layer DBL that cover the source electrodes 173, the drain electrodes 175, and the exposed portions of the semiconductor layers 154.

The passivation layer 180 may be formed of a material such as an inorganic insulator or an organic insulator and may have a flat surface. Further, the passivation layer 180 may have one or more layers and may be a planarizing layer.

Examples of the inorganic insulator may include SiNx and SiOx.

In the passivation layer 180, contact holes 185 are formed to expose a portion of the drain electrodes 175.

On the passivation layer 180, pixel electrodes 191 are formed to connect to the drain electrodes 175 through the contact holes 185.

The pixel electrodes 191 may be formed of a transparent conductive material such as indium tin oxide (ITO) or indium zinc oxide (IZO) or a reflective metal such as aluminum, silver, chromium, or an alloy thereof.

The pixel electrodes 191 are physically and electrically connected to the drain electrodes 175 through the contact holes 185 and receive a data voltage from the drain electrodes 175.

A pixel electrode 191 receiving the data voltage creates an electric field together with a common electrode (not shown) of another display panel (not shown) receiving a common voltage to determine the orientation of liquid crystal molecules (not shown) of a liquid crystal layer (not shown) between the pixel electrode 191 and the common electrode.

According to the orientation of the liquid crystal molecules determined as described above, the polarization of light passing through the liquid crystal layer may be rotated with respect to the initial polarization of the light.

The pixel electrode 191 and the common electrode form a capacitor, which is referred to as a "liquid crystal capacitor," to maintain an applied voltage even after the thin film transistor is turned off.

FIG. 3, FIG. 6, FIG. 9, and FIG. 14 are plan views of the thin film transistor display panel shown in FIG. 1 during various stages of its manufacture.

FIG. 4, FIG. 5, FIG. 7, FIG. 8, FIG. 10, FIG. 11, FIG. 12, FIG. 13, FIG. 15, and FIG. 16 are cross-sectional views of the thin film transistor display panel shown in FIG. 1 during various stages of its manufacture.

Figure 3:
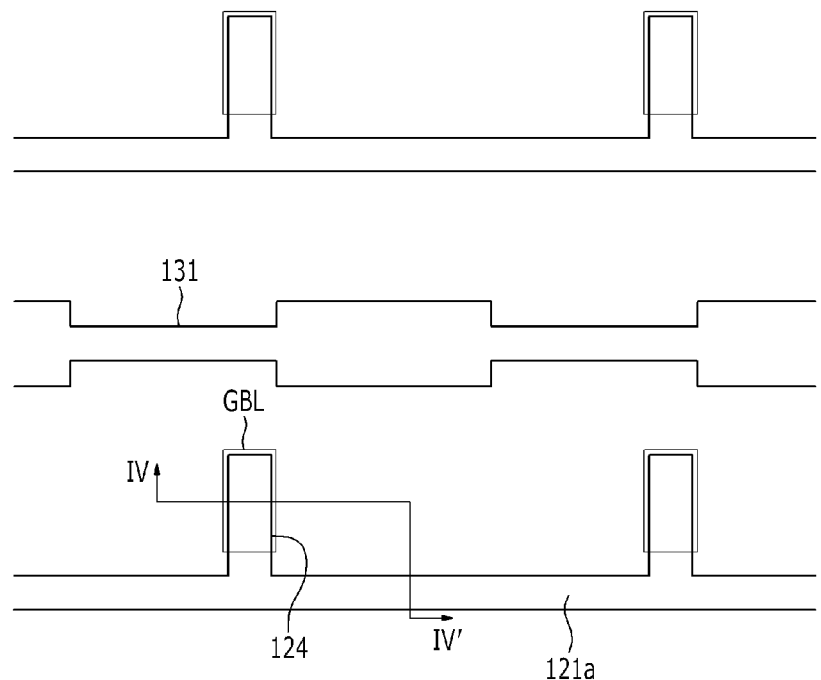
FIG. 3, FIG. 6, FIG. 9, and FIG. 14 are plan views of the thin film transistor display panel shown in FIG. 1 during various stages of its manufacture.
Figure 4:
FIG. 4, FIG. 5, FIG. 7, FIG. 8, FIG. 10, FIG. 11, FIG. 12, FIG. 13, FIG. 15, and FIG. 16 show cross-sections of the thin film transistor display panel shown in FIG. 1 during various stages of its manufacture.
Figure 5:
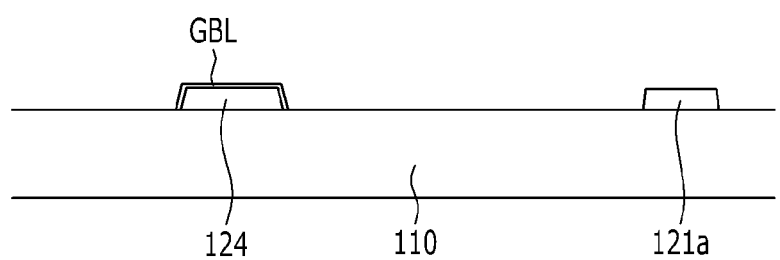

FIG. 4 and FIG. 5 show cross-sections along line IV-IV' of FIG. 3.

Referring to FIG. 3 and FIG. 4, a metal material is deposited on the insulation substrate 110, e.g., by a sputtering method followed by patterning to form the lower gate lines 121a, the gate electrodes 124 protruding from the lower gate lines 121a, and the storage electrode lines 131 that are disposed between two neighboring lower gate lines 121a.

Referring to FIG. 3 and FIG. 5, the first blocking layer GBL is formed to cover only the gate electrodes 124 and not the lower gate line 121a.

The first blocking layer GBL may be formed by photolithography using a mask or may be formed together with the lower gate lines 121a and the gate electrodes 124 by using a slit mask.

The first blocking layer GBL may be formed in an island shape and may be formed from an organic layer or an inorganic layer including SiNx.

Figure 6:
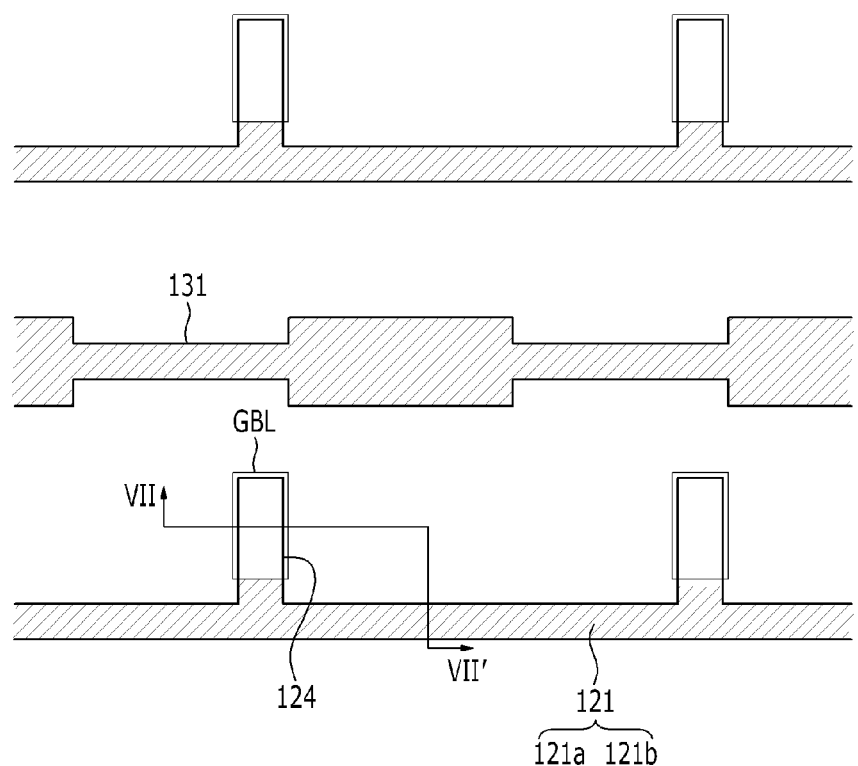
Figure 7:
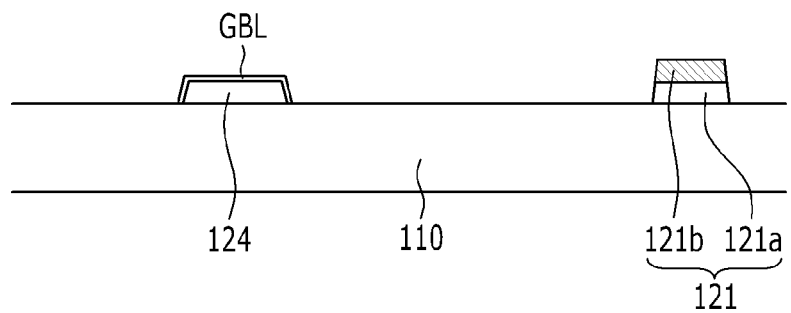
Figure 8:
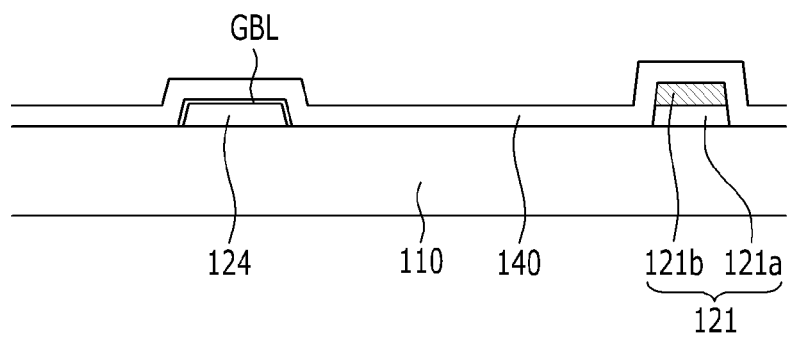

FIG. 7 and FIG. 8 show cross-sections along line VII-VII' of FIG. 6.

Referring to FIG. 6 and FIG. 7, the upper gate lines 121b are formed by using an electroless plating method using the lower gate lines 121a as a seed layer.

Since the gate electrodes 124 are covered by the first blocking layer GBL, the upper gate lines 121b are formed on only the lower gate lines 121a.

Since the lower gate lines 121a are used as a seed layer, the upper gate lines 121b may be formed substantially in the same shape as the lower gate lines 121a.

The gate electrodes 124 that are constituent elements for the thin film transistors and may be formed by sputtering. The gate lines 121 extend in the transverse direction and include the upper gate lines 121b and may be formed by an electroless plating method using the lower gate lines 121a as a seed layer.

The surface roughness of the gate electrodes 124 may increase when an additional metal layer is formed on the gate electrodes 124, for example, by electroless plating.

However, according to the present exemplary embodiment, since the upper gate lines 121b are formed by using an electroless plating method with the gate electrodes 124 covered by the first blocking layer GBL, the upper gate lines 121b are formed on the comparatively longer lower gate lines 121a. The process may maintain the thickness and structure of the channel regions while reducing the overall resistance of the display panel.

In brief, an electroless plating method according to an exemplary embodiment of the present invention may remove an organic material or oxide that remains on a metal layer pattern, e.g., the lower gate lines 121a, through a pre-dip process.

Next, palladium displacement plating is performed through an activation process.

After palladium displacement plating, metal ions are added together with a reducing agent through a plating process to form the upper gate lines 121b.

Referring to FIG. 8, the gate insulating layer 140 is formed from a material such as SiNx or SiOx on the gate lines 121 and the first blocking layer GBL that covers the gate electrodes 124.

Figure 9:
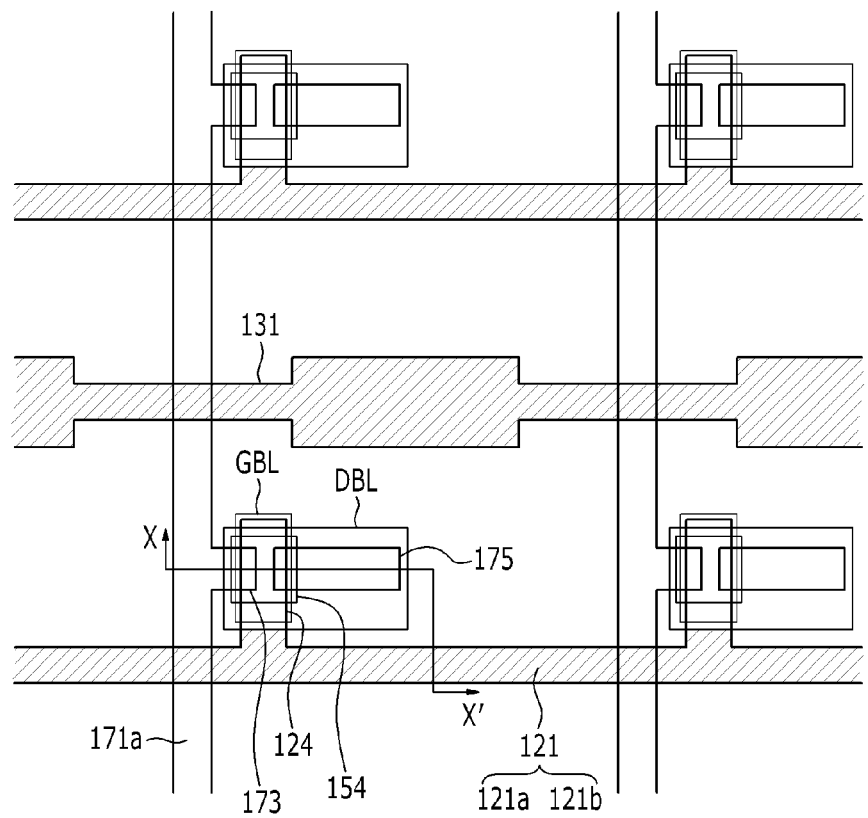

FIG. 10, FIG. 11, FIG. 12, and FIG. 13 show cross-sections of the TFT panel of FIG. 9 along line X-X' during the formation of the TFT panel.

Figure 10:
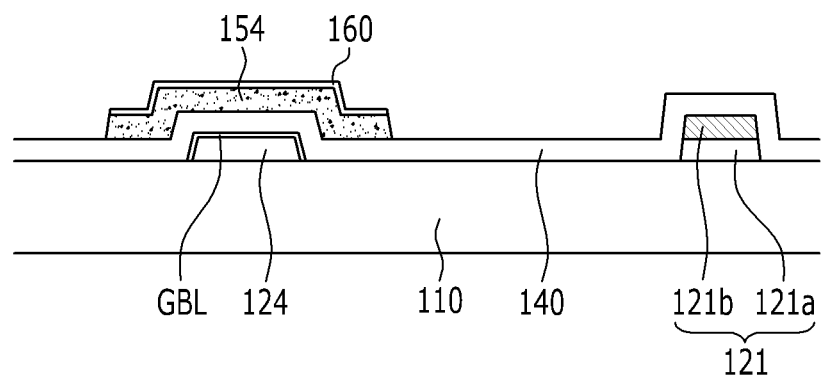

Referring to FIG. 9 and FIG. 10, the semiconductor layer 154 is formed on the gate insulating layer 140, and an ohmic contact material 160 is formed on the semiconductor layer 154.

Figure 11:
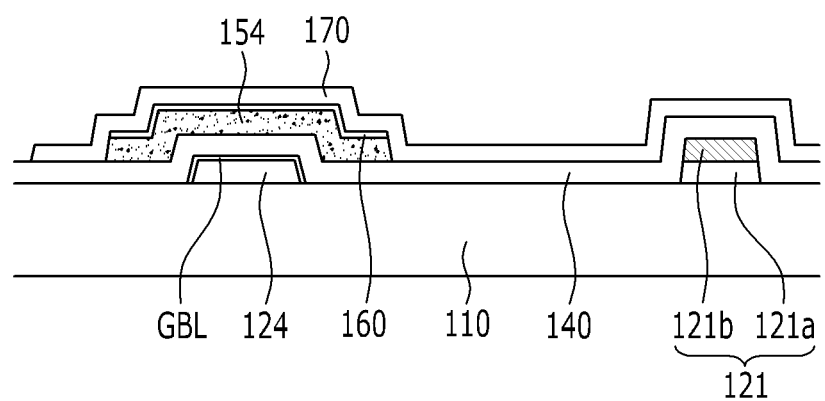

Referring to FIG. 9 and FIG. 11, a data wire line material 170 is formed, e.g., by sputtering or chemical vapor deposition to cover the semiconductor layer 154, the ohmic contact material 160, and the gate insulating layer 140.

Figure 12:
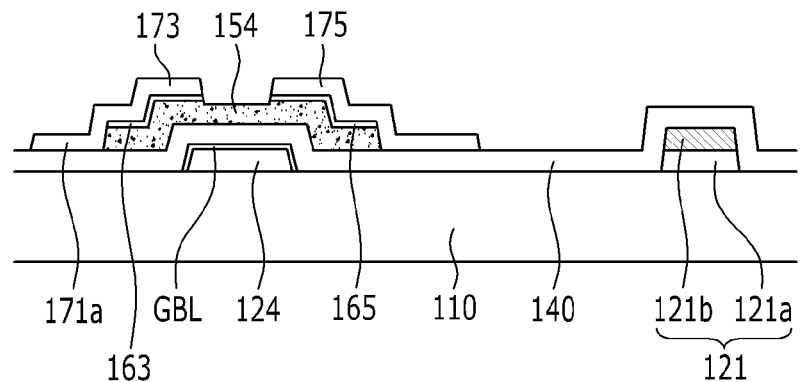

Referring to FIG. 9 and FIG. 12, the ohmic contacts 163 and 165, the source electrodes 173, the drain electrodes 175 opposing the source electrodes 173 on the gate electrodes 124, and the lower data lines 171a extending in the longitudinal direction to intersect the gate lines 121 are formed by using a photosensitive film pattern (not shown).

Here, the gate electrodes 124, the source electrodes 173, and the drain electrodes 175 form a TFT together with the semiconductor layer 154. The channels of the TFTs are formed in the semiconductor layers 154 between the source electrodes 173 and the drain electrodes 175.

Figure 13:
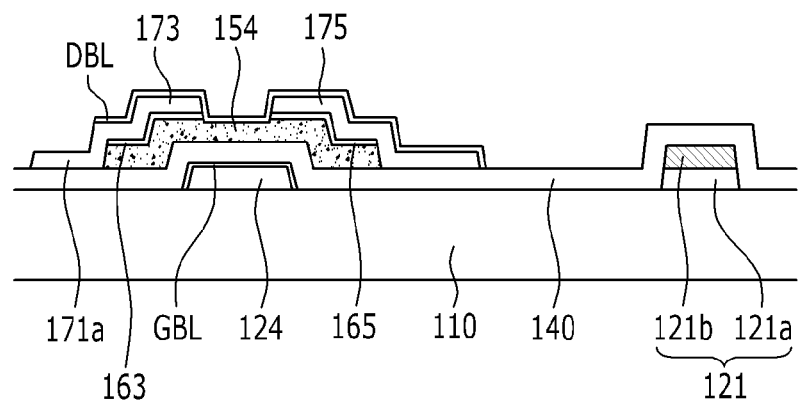

Referring to FIG. 9 and FIG. 13, the second blocking layer DBL is formed to cover the source electrodes 173, the exposed semiconductor layers 154, and the drain electrodes 175.

The second blocking layer DBL may be formed as an island shape and may be formed from an organic or an inorganic material that may include SiNx.

The second blocking layer DBL may be formed by photolithography using a mask or may be formed with the lower data lines 171a, the source electrodes 173, and the drain electrodes 175 when the lower data lines 171a, the source electrodes 173, and the drain electrodes 175 are formed by, e.g., using a slit mask.

Figure 14:
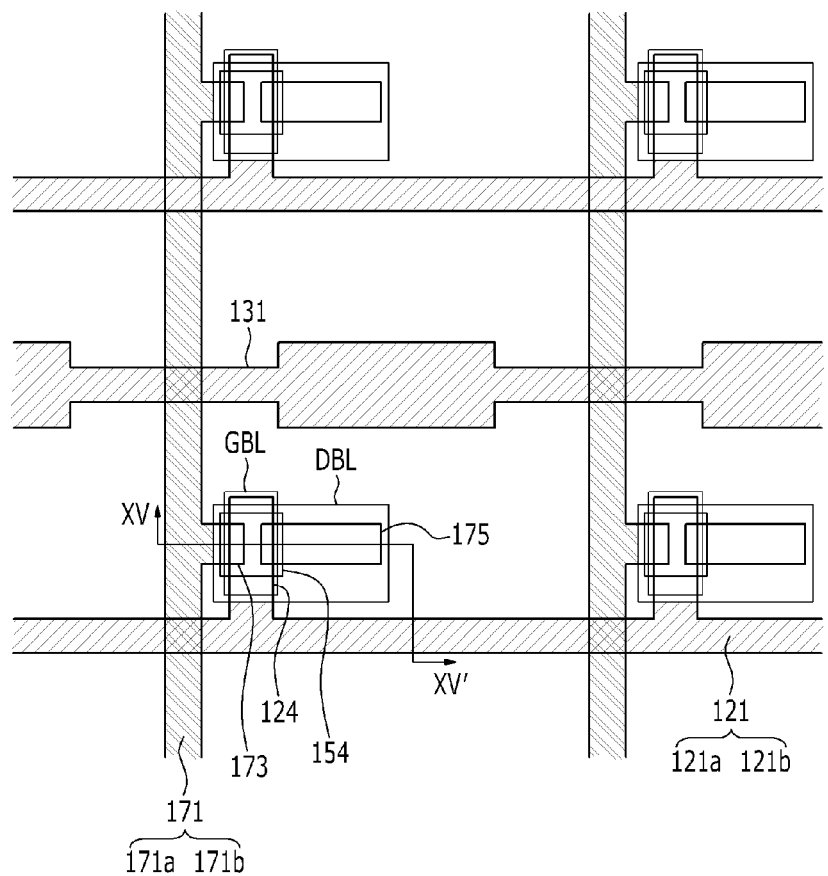
Figure 15:
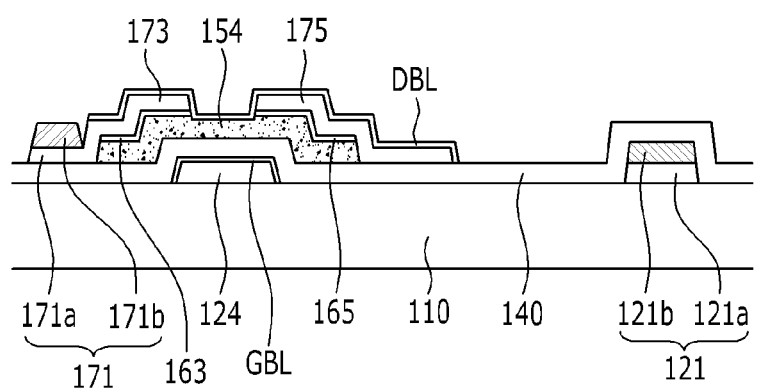

FIG. 15 shows a cross-section along line XV-XV' of FIG. 14.

Referring to FIG. 14 and FIG. 15, the upper data lines 171b may be formed by electroless plating with the lower data lines 171a as a seed layer.

Since the source electrodes 173 and the drain electrodes 175 are covered by the second blocking layer DBL, the upper data lines 171b are formed only on the lower data lines 171a.

Since the lower data lines 171a are used as a seed layer, the upper data lines 171b may be formed substantially in the same shape as the lower data lines 171a.

Figure 16:
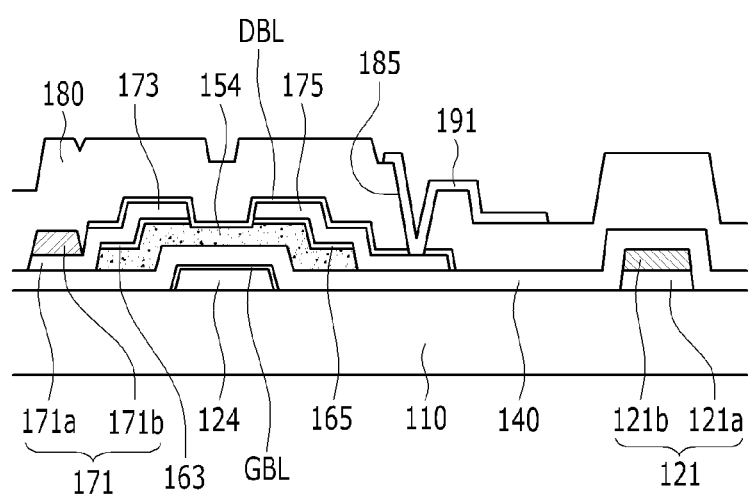

Referring to FIG. 16, the passivation layer 180 is formed on the data lines 171 and the second blocking layer DBL that covers the source electrodes 173, the drain electrodes 175, and the exposed portions of the semiconductor layers 154.

The contact holes 185 are formed to expose the drain electrodes 175 by performing photolithography on the passivation layer 180.

Next, the pixel electrodes 191 are formed to connect to the drain electrodes 175 through the contact holes 185.

The manufacturing method of a TFT display panel according exemplary embodiments of the present invention may reduce the resistance of the display by selectively forming thick wire lines only on a seed layer, e.g., a portion of a data line or a gate line. Increased surface roughness due to forming the thick wire lines may be prevented since the gate electrodes, the source electrodes, the drain electrodes, and the TFT channel regions do not form an additional metal layer during the process, i.e., these elements do not serve as a seed layer. As a result, reliable TFT channel formation may be expected.

In another exemplary embodiment of a TFT display panel, the TFT display panel may be substantially similar to that described in the previous exemplary embodiment. In the present exemplary embodiment, instead of the gate line and the date line being formed to have an additional layer as compared with the gate electrode and the source and drain electrodes, the gate line and the data line may be initially formed to have the same thicknesses as the gate electrode and the source and the drain electrodes. Subsequently, some of the gate electrode material may be removed by etching, for example, to decrease the thickness of the gate electrode decreasing the thickness of the gate line. Likewise, some of the source electrode and the drain electrode materials may be removed by etching, for example, to decrease their respective thickness without reducing the thickness of the data line.

It will be apparent to those skilled in the art that various modifications and variations can be made in the present invention without departing from the spirit or scope of the invention. Thus, it is intended that the present invention covers the modifications and variations of this invention provided they come within the scope of the appended claims and their equivalents.

What is claimed is:

1. A manufacturing method for a thin film transistor display panel, the method comprising:
   forming a gate wire extending in a first direction on a substrate, the gate wire comprising:
   a lower gate line arranged in the first direction; and
   a gate electrode protruding from the lower gate line;
   forming a first blocking layer on the gate electrode;
   forming an upper gate line on the lower gate line;
   forming a gate insulating layer on the upper gate line;
   forming a semiconductor layer on the gate insulating layer;
   forming a data wire comprising:
   a source electrode disposed on the semiconductor layer;
   a drain electrode disposed on the semiconductor layer and opposing the source electrode with respect to the gate electrode; and
   a lower data line extending in a second direction and intersecting the gate line;
   forming a passivation layer on the data wire and comprising a contact hole exposing a portion of the drain electrode; and
   forming a pixel electrode on the passivation layer and connected to the drain electrode through the contact hole,
   wherein forming the upper gate line comprises using an electroless plating method that uses the lower gate line as a seed layer.

2. The method of claim 1, wherein the lower gate line and the gate electrode are formed using a sputtering method.

3. The method of claim 2, wherein the first blocking layer is formed from an organic layer or an inorganic layer.

4. The method of claim 3, wherein the first blocking layer is formed from the inorganic layer, and the inorganic layer comprises a silicon nitride.

5. The method of claim 1, further comprising forming a second blocking layer on the source electrode, the semiconductor layer, and the drain electrode.

6. The method of claim 5, further comprising forming an upper data line on the lower data line after forming the second blocking layer.

7. The method of claim 6, wherein forming the source electrode, the drain electrode and the lower data line comprises using a sputtering method.

8. The method of claim 7, wherein forming the upper data line comprises using an electroless plating method that uses the lower data line as a seed layer.

9. The method of claim 5, wherein the second blocking layer is formed from an organic layer or an inorganic layer.

10. The method of claim 9, wherein the second blocking layer is formed from the inorganic layer, and the inorganic layer comprises a silicon nitride.

* * * * *